United States Patent
Ide

[11] Patent Number: 6,157,355
[45] Date of Patent: Dec. 5, 2000

[54] MATRIX TYPE DISPLAY DEVICE

[75] Inventor: Shigeo Ide, Yamanashi-ken, Japan

[73] Assignee: Pioneer Electronic Corporation, Tokyo, Japan

[21] Appl. No.: 09/056,605

[22] Filed: Apr. 8, 1998

[30] Foreign Application Priority Data

Apr. 25, 1997 [JP] Japan ..................... 9-123556

[51] Int. Cl.[7] ............................................. G09G 3/28
[52] U.S. Cl. ........................ 345/60; 345/72; 345/65
[58] Field of Search ....................... 345/60, 79, 65; 427/68; 313/506; 315/169.1; 349/109

[56] References Cited

U.S. PATENT DOCUMENTS

| | | | |
|---|---|---|---|
| 4,689,522 | 8/1987 | Robertson | 313/506 |
| 4,975,691 | 12/1990 | Lee | 345/79 |
| 5,113,274 | 5/1992 | Takahashi et al. | 349/109 |
| 5,629,716 | 5/1997 | Okamoto et al. | 345/60 |
| 5,661,500 | 8/1997 | Shinoda et al. | 345/60 |
| 5,674,553 | 10/1997 | Shinoda et al. | 427/68 |
| 5,854,540 | 12/1998 | Matsumoto et al. | 315/169.1 |

*Primary Examiner*—Steven J. Saras
*Assistant Examiner*—Fritz Alphonse
*Attorney, Agent, or Firm*—Arent Fox Kintner Plotkin & Kahn PLLC

[57] ABSTRACT

A plurality of row electrodes and a plurality of column electrodes are provided so as to intersect with each other to form a pixel at every intersection. A phosphor layer is provided along each of the column electrodes. The phosphor layer is disposed so that three unit luminous areas of red, green and blue are provided in each pixel. Three phosphor layers for a first pixel on a display line are disposed in order of red, green and blue, and three phosphor layers for a second pixel adjacent the first pixel are disposed in order of blue, green and red.

2 Claims, 3 Drawing Sheets

MATRIX TYPE DISPLAY DEVICE

BACKGROUND OF THE INVENTION

The present invention relates to a display device of a matrix type such as a plasma display panel (PDP), a liquid crystal display (LCD), and an electroluminescent display (ELD) for displaying color images.

Recently, as a display device becomes large in size, thickness of the display device is desired to be thin. Therefore, various types of display devices thin are supplied. In the display device such as PDP, LCD and ELD, three primary colors of red (R), green (G) and blue (B) are properly combined to display various color images. In the matrix display, three unit luminous areas corresponding to the three primary colors are provided in each pixel. As one of the matrix type display devices in which color images are properly displayed using a phosphor layer, a PDP of a surface discharge type using alternating current (AC) is known.

For example, a PDP of surface discharge type of three-electrode comprises a pair of front and rear substrates disposed opposite to each other, interposing a discharge space therebetween. The front substrate as a display portion has a plurality of row electrodes which are alternately disposed in pairs to be parallel with each other at the inside portion thereof. The row electrodes are covered by a dielectric layer at the discharge space. On the rear substrate, a plurality of column electrodes are formed on the inside portion thereof to intersect the row electrodes of the front substrate. A phosphor layer having a different luminous color covers each of the column electrodes. At the intersection of each of the column electrodes and each pair of row electrodes, a unit luminous area (discharge cell) is formed.

FIG. 3 shows an arrangement of pixels in the conventional PDP of surface discharge type.

A pair of row electrodes X and Y are laterally disposed, interposing a discharge gap at every line L as a display line. A plurality of column electrodes A (Ai, Ai+1, Ai+2 . . . ) are disposed to intersect the row electrodes X and Y. A plurality of phosphor layers 8 (8R, 8G and 8B) are provided on the column electrodes A. The phosphor layers 8R, 8G and 8B have luminous colors red (R), green (G) and blue (B) respectively, corresponding to the three primary colors R, G and B. The phosphor layers 8R, 8G and 8B are disposed on the column electrodes A in the order from the left to right in FIG. 3.

At the intersection of the data electrode A having the phosphor layer 8 and the row electrodes X and Y, a unit luminous area EU is defined. Corresponding to the luminous colors of the phosphor layers 8B, 8G and 8B, a unit luminous area EU(R) of red (R), a unit luminous area EU(G) of green (G), and a unit luminous area EU(B) of blue (B) are respectively defined.

A pixel EG consists of three unit luminous areas EU(R), EU(G) and EU(B) which are disposed in the order from the left to right in FIG. 3.

In a driving operation of the PDP, a unit period of display is divided into an address period and a discharge sustaining period.

In the address period, pixel data pulses are applied to the column electrodes, while scanning pulses are applied to one of the row electrodes by a selecting and writing address method or a selecting and erasing address method. Thus, a wall charge is accumulated only in the unit luminous area EU to be lighted every line in order.

In the discharge sustaining period, discharge sustaining pulses are alternately applied to the row electrodes X and Y. Thus, only the unit luminous area EU to be lighted which holds the wall charge sustains the discharge. If the number of applications of discharge sustaining pulses per unit time is properly set, the luminance of the display can be controlled.

In the address period, if a difference of potential is produced between the column electrodes, a reactive power produces by a parasitic capacitance between the data electrodes. In particular, in case of a monochromatic display by either of R, G or B, the reactive power increases. For example, in the monochromatic display of R, a parasitic capacitance between the column electrode of R and the column electrode of G adjacent to the column electrode of R, and a parasitic capacitance between the column electrode of R and the column electrode of B adjacent to the data electrode of R are equivalently loaded, thereby increasing the reactive power.

In order to reduce the parasitic capacitance between the column electrodes which causes the reactive power to increase, it is necessary to provide a sufficient large distance between the column electrodes. Therefore, it is difficult to obtain the PDP of high definition by reducing the distance between the column electrodes.

SUMMARY OF THE INVENTION

An object of the present invention is to provide a matrix type display device in which an increase in reactive power is suppressed, thereby ensuring high definition display.

According to the present invention, there is provided a matrix type display device having a plurality of row electrodes, a plurality of column electrodes which intersect with the row electrodes to form a pixel at every intersection, and a phosphor layer provided along each of the column electrodes, the phosphor layer being disposed so that three unit luminous areas of red, green and blue are provided in each pixel, wherein three phosphor layers for a first pixel on a display line are disposed in order of red, green and blue, three phosphor layers for a second pixel adjacent the first pixel are disposed in order of blue, green and red, and the first and second pixels are sequentially arranged.

The display device comprises a pair of substrates disposed opposite to each other, interposing a discharge space, the row electrodes are disposed on the substrate on a display side, and covered by a dielectric layer, each of the row electrodes comprises a transparent conductive film and a metallic film layered on the transparent electrode, the phosphor layers are provided on the substrate on a back side of the display.

These and other objects and features of the present invention will become more apparent from the following detailed description with reference to the accompanying drawings.

DETAILED DESCRIPTION OF THE PREFERRED EMBODIMENT

Figure 1:
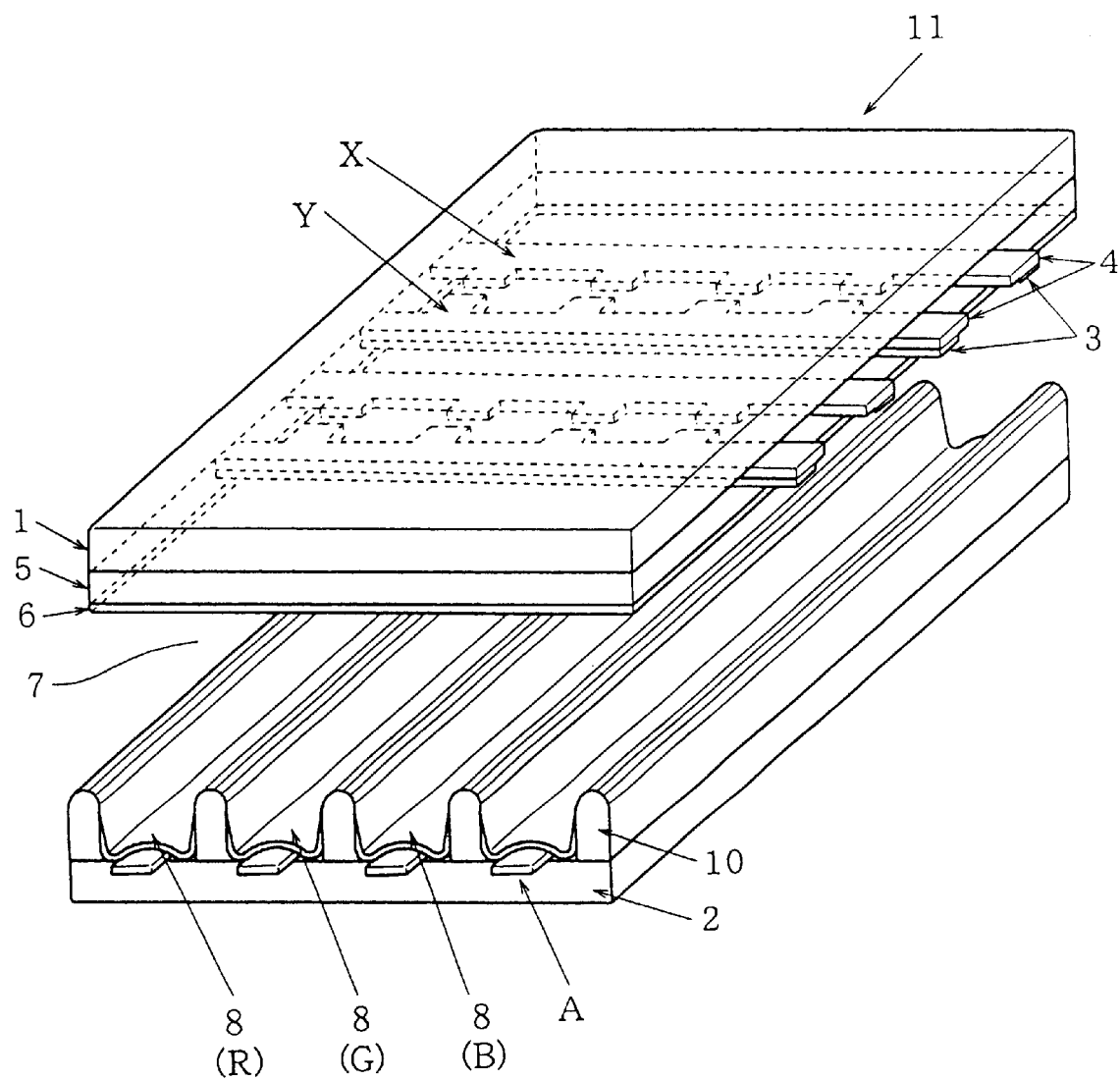
FIG. 1 is a schematic perspective view showing a plasma display panel according to the present invention.

FIG. 1 shows an ACPDP of a reflection type of three-electrode according to the present invention. An ACPDP 11 comprises a pair of glass substrates 1 and 2 disposed opposite to each other, interposing a discharge space 7 therebetween. The glass substrate 1 as a display portion has row electrodes (sustain electrodes) X and Y which are alternately disposed in pairs to be parallel with each other at the inside portion thereof. The row electrodes X and Y are covered by a dielectric layer 5 for producing wall charge. A protection layer 6 made of MgO is coated on the dielectric layer 5.

Each of the row electrodes X and Y comprises a transparent electrode 4 formed by a transparent conductive film having a large width and a bus electrode (metallic electrode) 3 formed by a metallic film having a small width and layered on the transparent electrode 4.

On the glass substrate 2 as a rear member, a plurality of elongated barriers 10 are provided at the inside portion thereof for defining the discharge space 7. The barrier 10 extends in the direction perpendicular to the row electrodes X, Y. Between the barriers 10, column electrodes (address electrodes) A are formed to intersect the row electrodes X and Y of the glass substrate 1. A phosphor layer 8 having a predetermined luminous color red (R), green (G) or blue (B) covers each of the column electrodes A and opposite side portions of the barrier 10. The discharge space 7 is filled with discharge gas consisting of neon mixed with xenon. Thus, a discharge cell (pixel) is formed at the intersection of the row electrodes in pairs and the column electrode.

Figure 2:
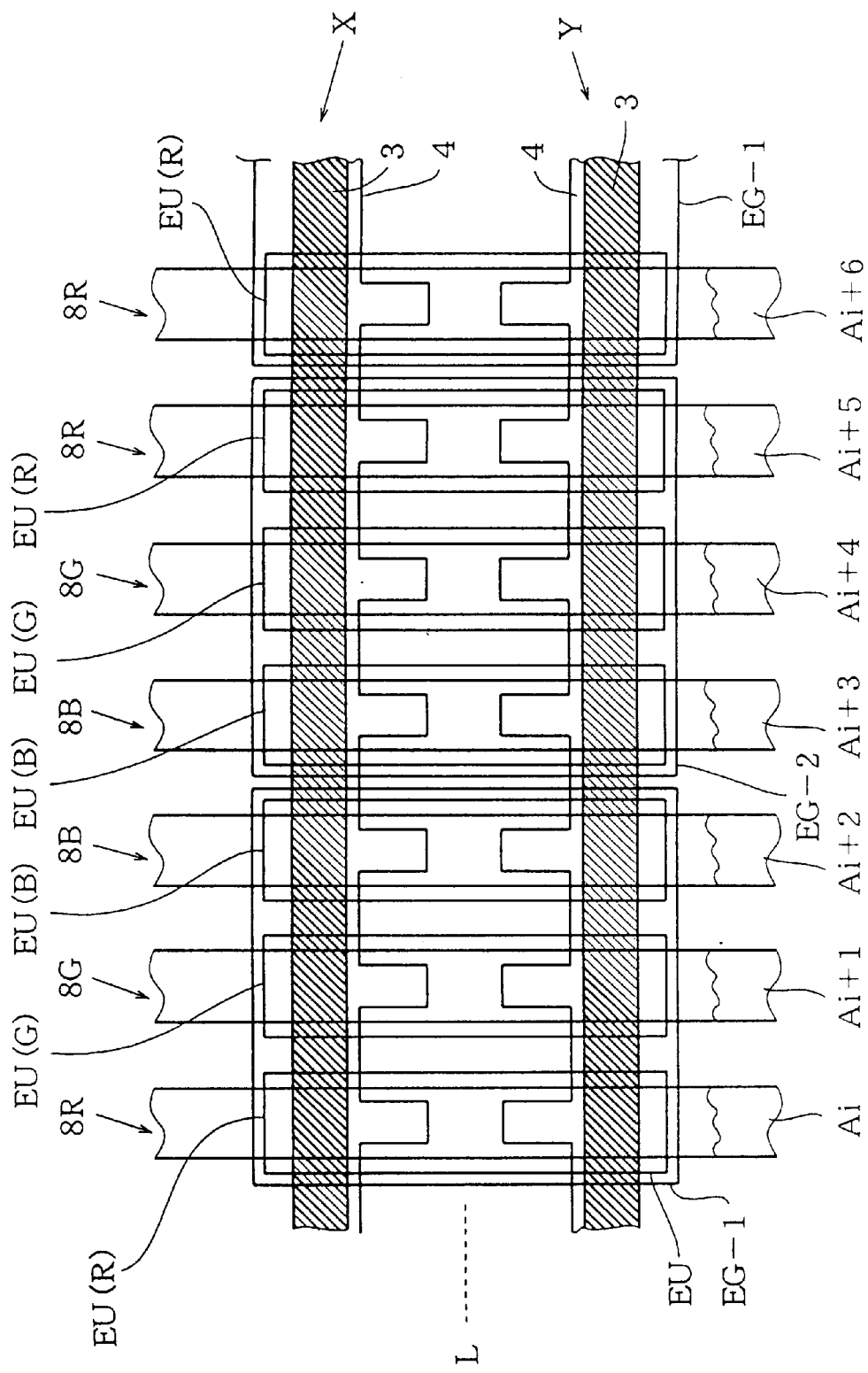
FIG. 2 is a schematic plan view showing the arrangement of pixels of the plasma display panel.
Figure 3:
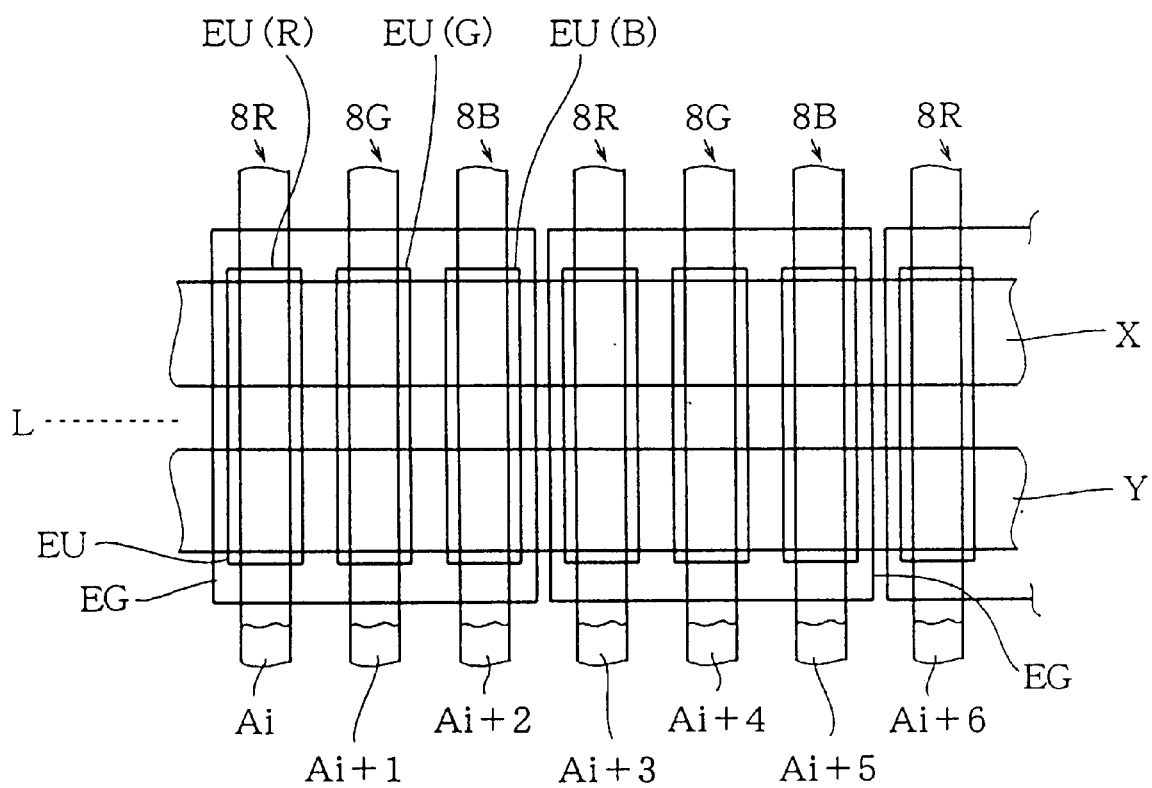
FIG. 3 is a schematic plan view of a conventional plasma display panel.

FIG. 2 shows an arrangement of pixels in the conventional PDP of surface discharge type.

A pair of row electrodes X and Y are laterally disposed, interposing a discharge gap at every display line L. A plurality of column electrodes A (Ai, Ai+1, Ai+2 . . . ) are disposed to intersect the row electrodes X and Y. A plurality of phosphor layers 8 (8R, 8G and 8B) are provided on the column electrodes A. The phosphor layers 8R, 8G and 8B have luminous colors red (R), green (G) and blue (B) respectively, corresponding to the three primary colors R, G and B.

At the intersection of the column electrode A having the phosphor layer 8 and the row electrodes X and Y, a unit luminous area EU(R) of red (R), a unit luminous area EU(G) of green (G), or a unit luminous area EU(B) of blue (B) is formed corresponding to each of the luminous colors of the phosphor layers 8B, 8G and 8B.

A pixel EG-1 comprises three unit luminous areas EUs in the order of EU(R), EU(G) and EU(B) from the left to right in FIG. 2, and a pixel EG-2 comprises three unit luminous areas EUs in the order of EU(B), EU(G) and EU(R) from the left to right in FIG. 2. The pixels EG-1 and EG-2 are alternately disposed along the display line L.

In the embodiment, the unit luminous area EU(R) of red (R) in the pixel EG-2 is disposed to adjoin the unit luminous area EU(R) of red (R) in the adjacent pixel EG-1. Similarly, the unit luminous area EU(B) of the blue (B) in the pixel EG-1 is disposed to adjoin the unit luminous area EU(B) of the blue (B) in the opposite adjacent pixel EG-2.

Therefore, in the case of the monochromatic display of R, only the parasitic capacitance between the column electrodes of R and G is equivalently loaded. Thus, the reactive power is reduced half.

Similarly, in the monochromatic display of B, only the parasitic capacitance between the column electrodes of B and G is equivalently loaded. Thus, the reactive power is reduced half.

Since the disposition of the unit luminous area EU(G) which has a high spectral luminous efficacy does not change, the resolution of display does not deteriorate.

In accordance with the present invention, in the monochromatic display of R or B, since the unit luminous area of R or B is disposed to adjoin each other in the adjacent pixels, the difference of potential is not produced. Thus, the reactive power is regulated from increasing. Since the distance between the column electrodes can be reduced, it is possible to obtain a display of high definition.

While the invention has been described in conjunction with preferred specific embodiment thereof, it will be understood that this description is intended to illustrate and not limit the scope of the invention, which is defined by the following claims.

What is claimed is:

1. A matrix type display device comprising:
   a plurality of row electrodes which define display lines;
   a plurality of column electrodes which intersect the row electrodes to thereby form a pixel at every intersection; and
   phosphor layers having luminous colors of red, green and blue provided across the row electrodes in such a way that three adjoining unit luminous areas of red, green and blue corresponding to the phosphor layers of the associated colors in each display line are associated with each of pixels arranged in such a manner that on the display line, those pixels whose three unit luminous areas are laid in order of red, green and blue and those pixels whose three unit luminous areas are laid in order of blue, green and red are alternately arranged.

2. The display device according to claim 1, wherein each of the row electrodes comprises a transparent conductive film and a metallic film laminated on the transparent electrode and is disposed on a display-side substrate and the phosphor layers are provided on a back-side substrate facing the display-side substrate with a discharge space interposed there between.

* * * * *